(12) United States Patent  (10) Patent No.: US 8,803,301 B2
Cho et al.  (45) Date of Patent: Aug. 12, 2014

(54) SEMICONDUCTOR PACKAGE

(75) Inventors: Kyong-soon Cho, Goyang-si (KR); Seung-kon Mok, Suwon-si (KR); Kwan-jai Lee, Yongin-si (KR); Jae-min Jung, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 313 days.

(21) Appl. No.: 13/427,435

(22) Filed: Mar. 22, 2012

(65) Prior Publication Data
US 2012/0274868 A1 Nov. 1, 2012

(30) Foreign Application Priority Data
Apr. 28, 2011 (KR) .................. 10-2011-0040140

(51) Int. Cl.
*H01L 23/495* (2006.01)
(52) U.S. Cl.
USPC .... 257/676; 257/669; 257/788; 257/E23.127; 257/E23.136; 257/E23.193
(58) Field of Classification Search
USPC ......... 257/666, 667, 669, 670, 676, 787, 788, 257/E23.127, E23.135, E23.136, E23.193
See application file for complete search history.

(56) References Cited

U.S. PATENT DOCUMENTS

| 6,617,680 | B2 * | 9/2003 | Chien-Chih et al. | 257/698 |
| 2007/0114640 | A1 * | 5/2007 | Kosowsky | 257/666 |
| 2011/0084370 | A1 * | 4/2011 | Su et al. | 257/669 |

FOREIGN PATENT DOCUMENTS

| KR | 0219080 | 6/1999 |
| KR | 2005-0104801 | 11/2005 |

* cited by examiner

*Primary Examiner* — Matthew E Warren
(74) *Attorney, Agent, or Firm* — Muir Patent Consulting, PLLC

(57) ABSTRACT

A semiconductor package may include a substrate, a semiconductor chip disposed on the substrate, a communication terminal and a static electricity inducing terminal connected to a ground. The package may include a first sealant that comprises a voltage sensitive material and that covers the semiconductor chip and a static electricity blocking layer that provides a conductive pathway from the first sealant to only the static electric inducing terminal. The static electricity blocking layer may prevent the communication terminal from being electrically connected to the first sealant. If a buildup of charge is applied to the device, the first sealant may become polarized and/or conductive. The extra voltage may travel through the first sealant to the static electricity inducing terminal via an opening in the static electricity blocking layer. The semiconductor chip and the communication terminal may not be affected by the extra charge.

20 Claims, 9 Drawing Sheets

SEMICONDUCTOR PACKAGE

CROSS-REFERENCE TO RELATED APPLICATIONS

This application claims the benefit of Korean Patent Application No. 10-2011-0040140, filed on Apr. 28, 2011, in the Korean Intellectual Property Office, the disclosure of which is incorporated herein in its entirety by reference.

BACKGROUND

The present disclosure relates to a semiconductor package, and more particularly, to a semiconductor package for protecting a semiconductor chip from static electricity or electrical shock.

In general, a semiconductor package may be formed by a series of steps. For example, a semiconductor chip may be die-bonded on a surface of an element such as a lead frame, a printed circuit board, or the like. The semiconductor chip may be wire-bonded or soldering may occur to electrically connect leads of the lead frame or terminals of the printed circuit board to the semiconductor chip. The semiconductor chip may then be covered with a sealant having insulating properties, to seal the semiconductor chip.

SUMMARY

The present disclosure provides a semiconductor package for protecting a semiconductor chip by inducing a buildup of charge to the outside through a ground terminal. The buildup of charge may have been directly applied to a sealant of the semiconductor package.

An exemplary semiconductor package comprises a substrate, at least a first semiconductor chip disposed on the substrate, at least a first communication terminal disposed on the substrate, the first communication terminal being electrically connected to the first semiconductor chip and to an external source, at least a first inducing terminal disposed on the substrate, the first inducing terminal being electrically connected to the semiconductor chip and to a ground, an external covering enclosing at least a portion of the first semiconductor chip, an external surface of the external covering being exposed to the outside of the semiconductor package, a static electricity blocking layer disposed between the external covering and the first inducing terminal and between the external covering and the first communication terminal, the static electricity blocking layer configured to prevent a conductive pathway from being formed between the external covering and the first communication terminal, and at least a first opening formed in the static electricity blocking layer, wherein the external covering is configured to be electrically connected to the first inducing terminal via the first opening.

An exemplary semiconductor package comprises a substrate, at least a first semiconductor chip disposed on the substrate, at least a first terminal disposed on the substrate, the first terminal being electrically connected to the semiconductor chip and to an external source, a second terminal disposed on the substrate, the second terminal being electrically connected to the semiconductor chip and to a ground, a first sealant surrounding at least a portion of the semiconductor chip, the first sealant comprising a voltage sensitive material, a static electricity blocking layer disposed between the first sealant and the second terminal and between the first sealant and the first terminal, the static electricity blocking layer configured to prevent a conductive pathway from the first sealant to the first terminal, and a static electricity inducer including a conductive material, the static electricity inducer disposed to contact the first sealant and to be electrically connected to the second terminal.

An exemplary semiconductor package comprises a substrate, at least a first semiconductor chip disposed on the substrate, at least a first communication terminal disposed on the substrate, the first communication terminal being electrically connected to the first semiconductor chip and to an external source, at least a first inducing terminal disposed on the substrate, the first inducing terminal being electrically connected to the semiconductor chip and to a ground, at least a first space filled with a non-conductive material and disposed to cover at least an active side of the first semiconductor chip and to surround at least one signal transmitting unit, wherein the signal transmitting unit is configured to electrically connect the first semiconductor chip to the first communication terminal, a static electricity inducer including a conductive material, the static electricity inducer disposed to surround the first space and to be electrically connected to the first inducing terminal, and a static electricity blocking layer disposed between the static electricity inducer and the first inducing terminal and between the static electricity inducer and the first communication terminal, the static electricity blocking layer configured to prevent a conductive pathway from being formed between the static electricity inducer and the first communication terminal.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
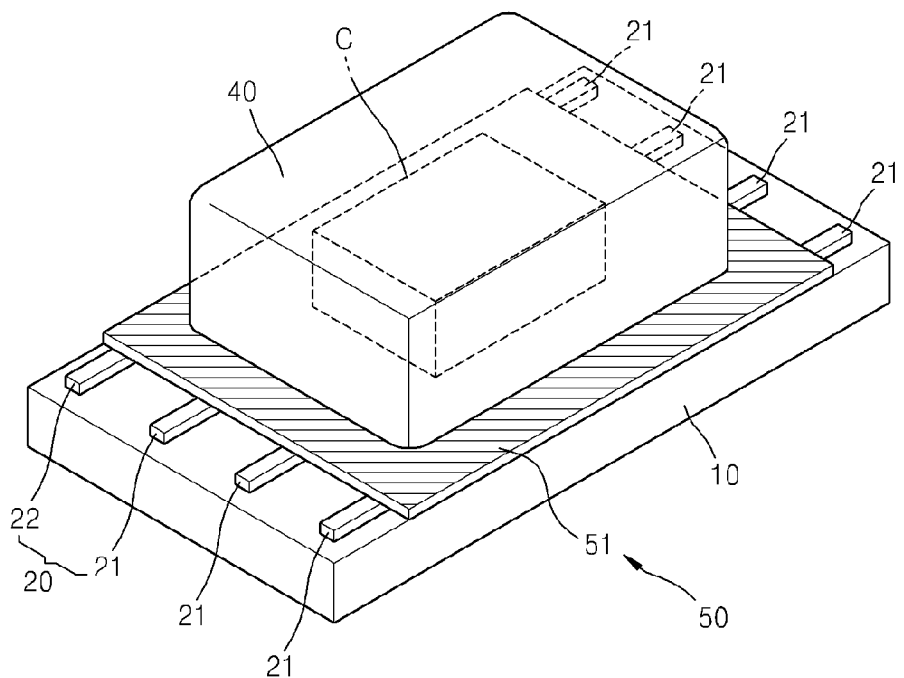
FIG. 1 is an external perspective view conceptually illustrating a semiconductor package according to an exemplary embodiment.

The present disclosure will now be described more fully with reference to the accompanying drawings, in which various embodiments are shown. The invention may, however, be embodied in many different forms and should not be construed as being limited to the embodiments set forth herein.

Embodiments described herein will be described referring to plan views and/or cross-sectional views by way of ideal schematic views. Accordingly, the exemplary views may be modified depending on manufacturing technologies and/or tolerances. Therefore, the disclosed embodiments should not be construed as being limited to those shown in the views, but include modifications in configuration formed on the basis of manufacturing processes. Therefore, regions exemplified in figures may have schematic properties, and shapes of regions shown in figures exemplify specific shapes of regions of elements, and the specific properties and shapes do not limit aspects of the invention. Like reference numerals refer to like elements throughout. In the drawings, the size and relative sizes of elements or regions may be exaggerated for clarity.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
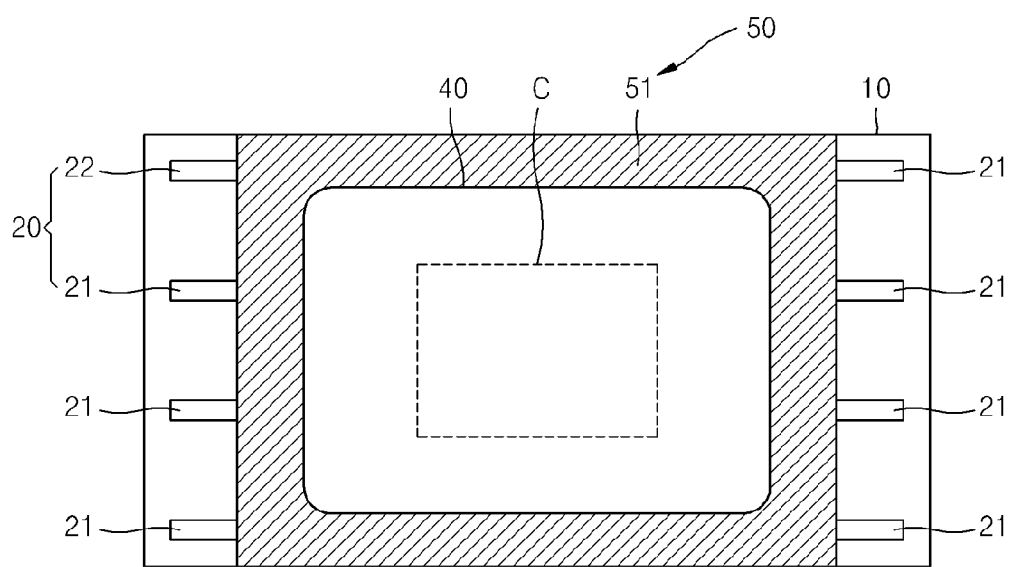
FIG. 2 is an exemplary plan view of the semiconductor package of FIG. 1.
Figure 3:
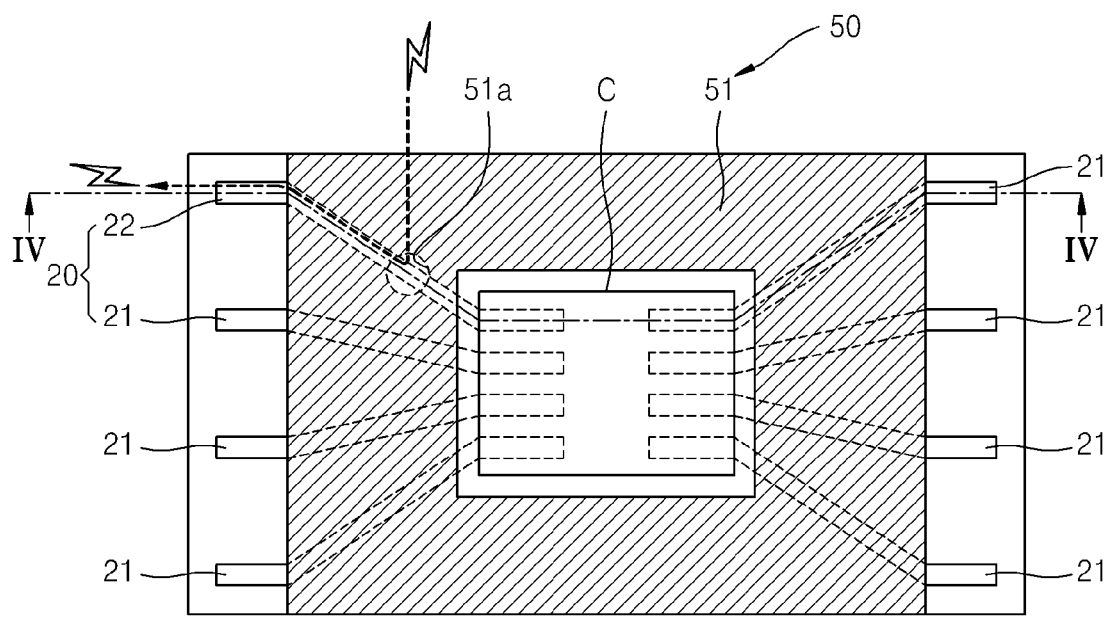
FIG. 3 is a plan view illustrating a static electricity blocking layer of the semiconductor package according to an exemplary embodiment.
Figure 4:
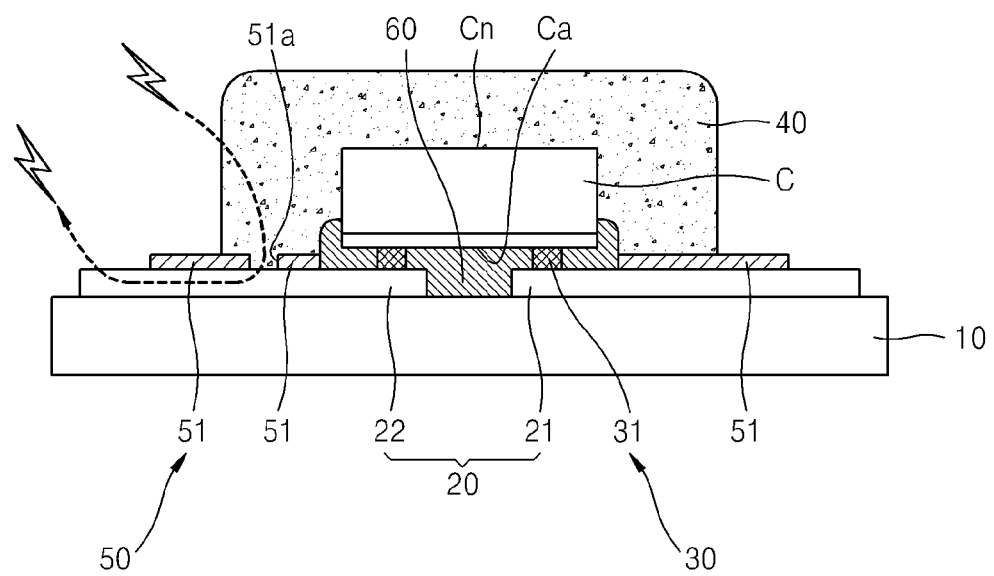
FIG. 4 is an exemplary cross-sectional perspective view taken along the line IV-IV of FIG. 3.

FIG. 1 is an external perspective view conceptually illustrating a semiconductor package according to an exemplary embodiment, and FIG. 2 is a plan view of the semiconductor package of FIG. 1. FIG. 3 is a plan view showing a static electricity blocking layer 51, which is part of a static electricity blocking unit 50, by removing a first sealant 40 of FIG. 2. FIG. 4 is a cross-sectional perspective view taken along the line IV-IV of FIG. 3.

As illustrated in FIG. 1 through FIG. 4, the semiconductor package may include a semiconductor chip C, a substrate 10, terminals 20, a signal transmitting medium 30, a first external covering, such as first sealant 40, and a static electricity blocking unit 50.

A semiconductor chip C, as illustrated in FIG. 4, may be a flip chip which is disposed so that an active side Ca of the semiconductor chip C faces toward the substrate 10. Minute circuits, which are formed through various semiconductor processes, are integrated in the active side Ca of the semiconductor chip C, and thus, the semiconductor chip C may be very sensitive to a buildup of electric charge, such as charge resulting from static electricity, an overvoltage, or electrical shock. Static electricity, for example, involves the build-up of electric charge on the semiconductor package, which will likely remain on the package unless the charge is directed to a ground or neutralized in some other way. A buildup of extra charge may remain on a surface when at least one of the surfaces has a high resistance to electrical flow. In some embodiments, a buildup of extra charge may remain on a semiconductor package, as the package material may be an insulator with a high resistance to electrical flow. In some embodiments, even a voltage of as little as 3 volts may have a negative effect on the minute circuits. In certain embodiments, the semiconductor chip C may be a driver chip applied to various flat panel displays, a memory chip, a microprocessor chip, or the like.

In addition, the substrate 10, which supports the semiconductor chip C, may be formed with a film including a flexible material such as polymer, resin, or the like. The substrate 10 may be formed with various types of printed circuit boards. The type or kind of printed circuit board used with the substrate 10 is not limited to those described herein.

The terminals 20, which are formed on the substrate 10 through various semiconductor processes, may include at least one communication terminal 21 and at least one static electricity inducing terminal 22. The communication terminals 21 are disposed on the substrate 10 and are protected from buildup of extra resulting from, for example, static electricity, or extra charge due to an overvoltage or an electric shock on an external surface of the first sealant 40. The communication terminals 21 may transmit various electrical signals (e.g. data, command, and/or address signals) to the semiconductor chip C from an external source and may transmit various electrical signals to the outside from the semiconductor chip C. The communication terminals 21 may also transfer voltage and/or power to the semiconductor chip from an external source.

Figure 15:
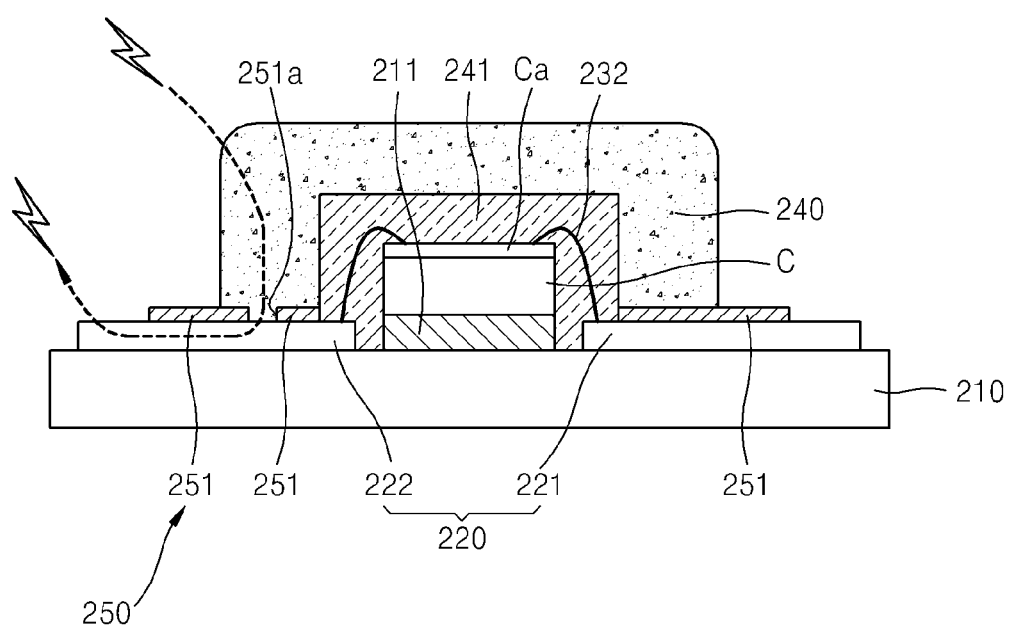
FIG. 15 is a cross-sectional view illustrating a semiconductor package according to an exemplary embodiment.

A signal transmitting medium 30, which electrically connects the semiconductor chip C to the terminals 20, may include a bump 31 as illustrated in FIG. 4. In some embodiments, the signal transmitting medium 30 may be also formed with a wire 232, as illustrated in FIG. 15 and described below. In addition, although not illustrated here, the signal transmitting medium 30 may be formed with various signal transmitting media such as a solder ball, a penetrating electrode, and the like. The type of media used to form the signal transmitting medium 30 is not limited to the examples described herein.

The static electricity inducing terminal 22 is electrically distinguished from the communication terminals 21. The static electricity inducing terminal 22 is disposed on the substrate 10 so that an electric charge on the semiconductor package may flow through the static electricity inducing terminal 22 to a ground. The communication terminals 21 are protected from a buildup of electric charge, such as static electricity and/or potential electrical shock by a static electricity blocking unit 50.

In some embodiments, the static electricity inducing terminal 22 is connected to the semiconductor chip C and functions as a ground terminal for grounding. For example, the static electricity inducing terminal 22 may be a VSS terminal. The static electricity inducing terminal 22 may remove static electricity and/or electrical shock to the outside. In some embodiments, in a situation in which external static electricity and electrical shock are applied to or form on the semiconductor package, the static electricity inducing terminal 22 may remove the static electricity and the electrical shock to the outside (i.e. by serving as a ground terminal).

In some embodiments, the static electricity inducing terminal 22 has a conductive connection to a sealant of the semiconductor package. For example, the static electricity inducing terminal 22 may be directly or indirectly electrically connected to a sealant, such as first sealant 40. A conductive pathway may exist between the static electricity inducing terminal 22 and the first sealant 40 that a charge is able to flow from an external surface of the first sealant 40, through the first sealant 40 and any conductive connections between the first sealant 40 and the static electricity inducing terminal 22, to the static electricity inducing terminal 22. To protect the communication terminals 21 from the static electricity or electric shock, a conductive pathway should not exist from the sealant of the semiconductor package to any of the communication terminals 21. When external static electricity and electrical shock are applied to the semiconductor package, and specifically to the first sealant 40, the static electricity inducing terminal 22 may induce the static electricity and/or the electrical shock and may act as a ground terminal for the extra electric charge. In some embodiments, a conductive pathway to only the static electricity inducing terminal 22 may be available by using the first sealant 40 and the static electricity blocking unit 50. The first sealant 40 and the static electricity blocking unit 50 will be described further below.

The first sealant 40 may protect the semiconductor chip C by surrounding it. In some embodiments, the first sealant 40 may include a voltage sensitive material that changes from an insulator to a conductor when a large voltage is applied. For example, the voltage sensitive material may contain properties that change from being insulating to having electrical conductivity when a voltage which is equal to or higher than a threshold voltage is input. In some embodiments, the threshold voltage is a physical properties conversion value that corresponds to the insulating properties of the voltage sensitive material. In some embodiments, the voltage sensitive material of the first sealant 40, which is an insulator, may be a poor conductor. A sudden charge of electrons, due to static electricity, an electrical shock, and/or an overvoltage that exceeds a threshold voltage level of the voltage sensitive material, may cause the voltage sensitive material to become polarized and/or act as a conductor.

In some embodiments, the voltage sensitive material may include, for example, a dielectric material having a volume of approximately 20 through 90 percent of the entire material, an electric conductor having a volume of approximately 0.01 through 80 percent of the entire material, and a semiconductor material having a volume of approximately 0 through 80 percent of the entire material. In some embodiments, the dielectric material may include silicone polymers, epoxies, polyimide, polyethylene, polypropylene, polyphenylene oxide, polysulphone, solgel materials, ceramers, silicon dioxide, aluminum oxide, zirconium oxide, metal oxide insulators, or the like. In some embodiments, the electric conductor may include copper, aluminum, nickel, stainless steel, or the other metal. The semiconductor may include silicon, silicon carbide, boron nitride, aluminum nitride, nickel oxide, zinc oxide, zinc sulfide, poly-3-hexylthiophene, pentacene, perylene, carbon nanotubes, fullerenes, or the like. In one embodiment, the dielectric material, electric conductor, and semiconductor material of the voltage sensitive material is evenly distributed across the voltage sensitive material. In some embodiments, the voltage sensitive material may be a voltage switchable material. In some embodiments, if static electricity, an overvoltage, or an electrical shock is applied to an external surface of the first sealant 40, the first sealant 40, which is normally an insulator, may become polarized and/or conductive, and may transmit the static electricity (or extra charge) to the static electricity inducing terminal 22.

In some embodiments, the static electricity blocking unit 50 creates a conductive connection between the first sealant 40 and the static electricity inducing terminal 22, for the extra charge or static electricity to travel from the first sealant 40 to the static electricity inducing terminal 22. In these embodiments, the static electricity blocking unit 50 may also prevent a conductive pathway from existing between the first sealant 40 and other parts of the semiconductor package, such as the static electricity blocking terminals 21. In some embodiments, and as illustrated in FIGS. 3 and 4, the static electricity blocking unit 50 may include a static electricity blocking layer 51. The static electricity blocking layer 51 may be disposed between the first sealant 40 and the communication terminals 21. The static electricity blocking layer 51 may insulate the communication terminals 21 from the first sealant 40 by covering the communication terminals 21. In some embodiments, the static electricity blocking layer 51 is an insulator.

In some embodiments, a penetrating opening 51a may be formed in the static electricity blocking layer 51 to enable a conductive pathway between the static electricity inducing terminal 22 and the first sealant 40. In these embodiments, the penetrating opening 51a may be formed so that the static electricity inducing terminal 22 is electrically connected to the first sealant 40. In some embodiments, an extra charge due to an electrical shock, an overvoltage, or static electricity may travel from an external surface of the first sealant 40 through the conductive pathway formed by the penetrating opening 51a to the static electricity inducing terminal 22, which serves as a ground terminal for the extra charge.

In some embodiments, the penetrating opening 51a may enable a conductive pathway from the first sealant 40 to only the static electricity inducing terminal 22. In some embodiments, the static electricity blocking layer 51 is disposed between the first sealant 40 and the communication terminals 21, such that the communication terminals 21 do not contact, meet, intersect, or in any way touch the first sealant 40. The static electricity blocking layer 51 may prevent an extra charge or static electricity from being transmitted from an external surface of the first sealant 40 to the communication terminals 21.

In some embodiments, the static electricity blocking layer 51 may be partially disposed between the first sealant 40 and the terminals 20. The static electricity blocking layer 51 may be disposed to cover all of the communication terminals 21, such that there is no electrical connectivity between the first sealant 40 and the communication terminals 21, and may extend to cover a portion of the static electricity inducing terminal 22. For example, the static electricity blocking layer 51 may be disposed between the first sealant 40 and the communication terminals 21 so as not to provide a conductive pathway to the protected terminals 21, and may also be disposed across the static electricity inducing terminal 21 with a penetrating opening 51a formed therein, such that a conductive pathway exists between the first sealant 40 and the static electricity inducing terminal 22. The static electricity blocking layer 51 may be disposed between the first sealant 40 and the static electricity inducing terminal 22 such that the extra charge or static electricity at the surface of the first sealant 40 may travel through the penetrating opening 51a to the static electricity inducing terminal 22 (and then to the outside). The penetrating opening 51a may be a hole or other opening in the static electricity blocking layer 51.

In some embodiments, and as illustrated in FIG. 3, the penetrating opening 51a may be a round-shaped opening. In these embodiments, the round-shaped opening may have a round edge and thus prevent the first sealant 40 or the static electricity blocking layer 51 from being easily exfoliated or damaged by an external force, static electricity, electrical shock, a short circuit, or the like. In some embodiments, the penetrating opening 51a may be an opening formed lengthwise along the static electricity inducing terminal 22 or an opening formed in various shapes such as a polygon, an oval, a cross, a tight line, a waveform, and the like. The shape of the penetrating opening 51a is not limited to the examples described above. In some embodiments, more than one penetrating opening 51a may be formed in the static electricity blocking layer 51. In some of those embodiments, there may be more than one static electricity inducing terminal 22 in the semiconductor package, and the number of penetrating openings 51a may correspond to the number of static electricity inducing terminals 22. For example, for each static electricity inducing terminal 22, there may be a penetrating opening 51a that is used as a conductive connection between that static electricity inducing terminal 22 and the first sealant 40. In some embodiments, the static electricity blocking layer 51 may be formed with a solder resist layer that covers and protects the communication terminals 21 and the static electricity inducing terminal 22 during fabrication of the substrate 10 for convenience of processes and cost reduction.

In some embodiments, static electricity, or extra charge, may flow through the semiconductor package as follows. As illustrated in FIGS. 3 and 4, if static electricity is applied to an external surface of the first sealant 40 from the outside, the first sealant 40, which has insulating properties, may become polarized and/or have an electrical conductivity. The static electricity or extra charge may travel to the static electricity inducing terminal 22, which is in electrical contact with the first sealant 40 through the first sealant and/or the penetrating opening 51a. The static electricity inducing terminal 22, which may serve as a grounding terminal, may remove the static electricity to the outside along the dotted line arrow of FIGS. 3 and 4.

In some embodiments, although the static electricity inducing terminal 22 is electrically connected with the semiconductor chip C through the bump 31, an electrical capacity of the static electricity inducing terminal 22 is much larger than that of the semiconductor chip C because the static electricity inducing terminal 22 is connected to the outside. In these embodiments, the static electricity (or extra charge) does not flow to the semiconductor chip C, and the semiconductor chip C may be protected from static electricity or extra charge. Although not illustrated, in some embodiments, the static electricity inducing terminal 22 may be electrically severed from the semiconductor chip C.

In some embodiments, as illustrated in FIG. 4, an under-fill 60 may be disposed to cover an active side Ca of the semiconductor chip C and the signal transmitting medium 30. The under-fill 60 may more strongly electrically and/or physically protect the active side Ca of the semiconductor chip C and the signal transmitting medium 30.

Figure 16:
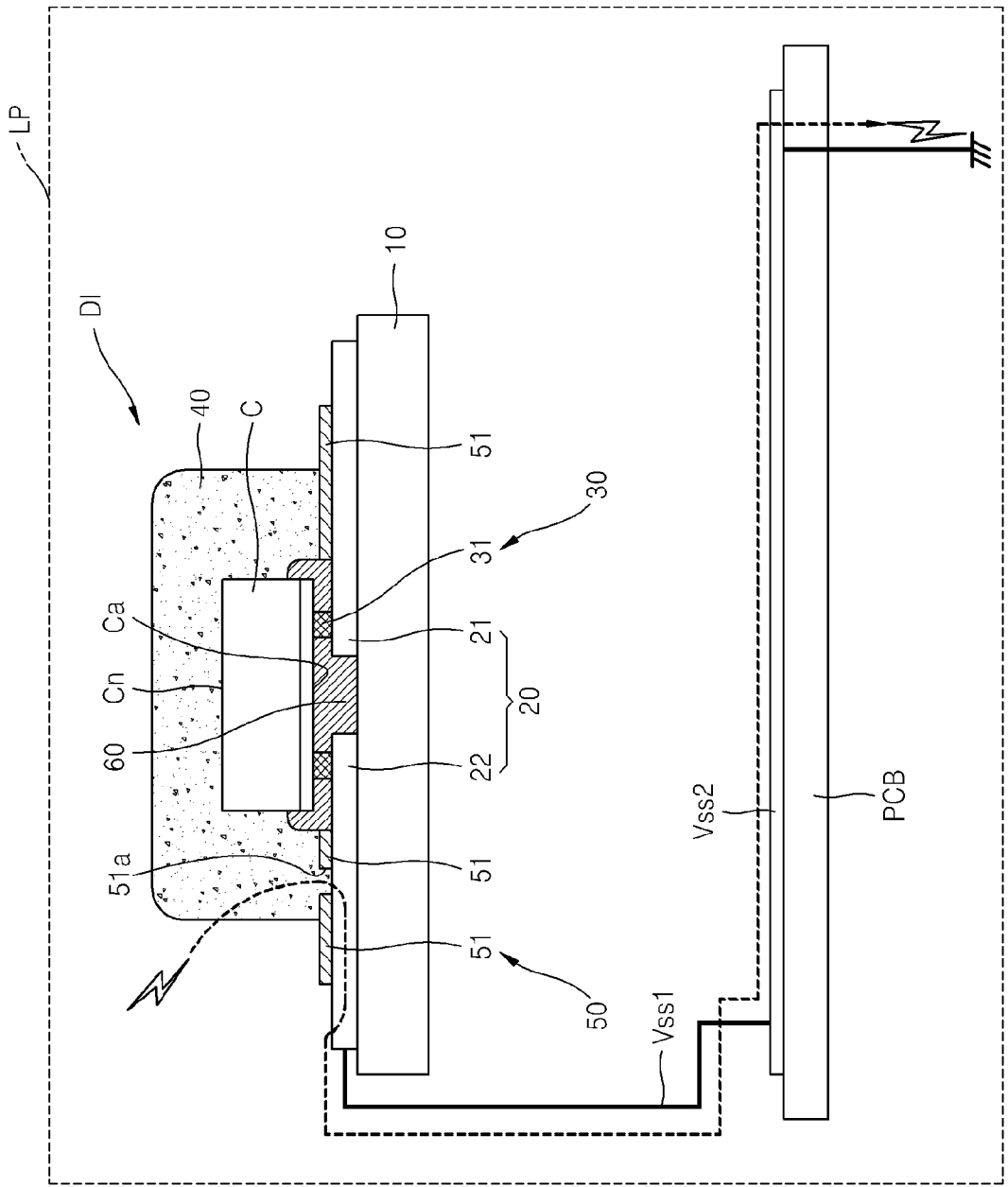
FIG. 16 is a conceptual diagram illustrating a state where a semiconductor package of FIG. 4 is disposed in a liquid crystal display (LCD) panel according to an exemplary embodiment.

FIG. 16 is a conceptual diagram illustrating, as an example, an exemplary semiconductor package like that shown in FIG. 4, that is disposed in a liquid crystal display (LCD) panel as a driver integrated circuit (IC).

In some embodiments, the static electricity inducing terminal 22 may be grounded to the outside. For example, the static electricity inducing terminal 22 may be electrically connected with a ground line Vss1 of a LCD panel LP and/or a ground line Vss2 of a printed circuit board (PCB) which is disposed in a panel printed circuit board PCB. In some embodiments, and as illustrated as an example in FIG. 16, if static electricity is applied to the first sealant 40 from the outside, the first sealant 40, which has insulating properties, may be polarized and/or have an electrical conductivity. The static electricity may be transmitted, along the dotted line arrow of FIG. 16, to the static electricity inducing terminal 22, which electrically contacts the first sealant 40 through the penetrating opening 51a. The static electricity may be removed to the outside through the ground line Vss1 of the LCD panel LP and the PCB ground line Vss2 of the panel printed circuit board PCB.

FIGS. 5 through 15 are cross-sectional views illustrating semiconductor packages according to exemplary embodiments.

Figure 5:
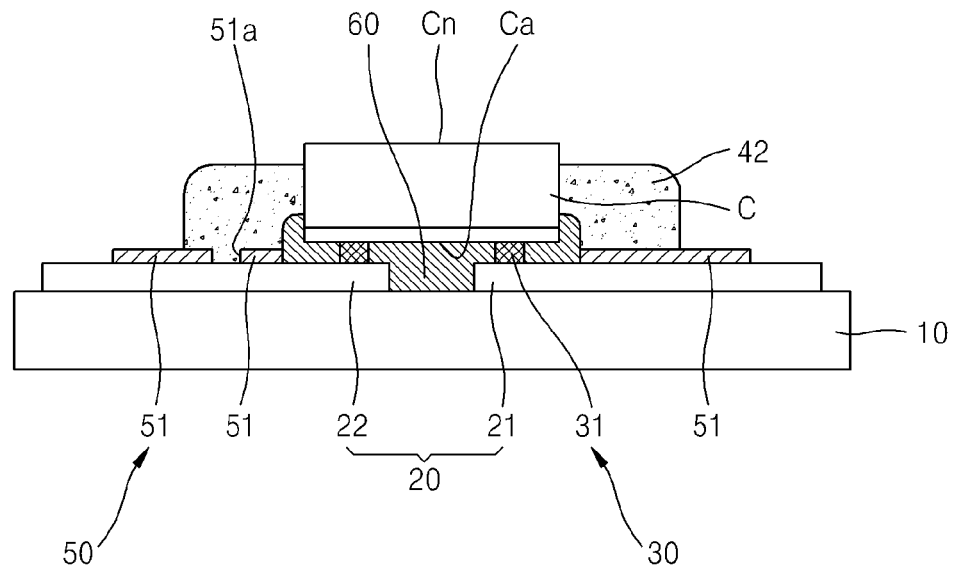
FIG. 5 is a cross-sectional view illustrating a semiconductor package according to an exemplary embodiment.

In some embodiments, and as illustrated in FIG. 5, the first sealant 42 may be formed in a shape surrounding a portion of the semiconductor chip C that at least includes an active side Ca of the semiconductor chip C. An inactive side Cn of the semiconductor chip C may be exposed to the outside. In this embodiment, although the inactive side Cn of the semiconductor chip C is exposed to the outside, a backside of the semiconductor chip C, including the inactive side Cn of the semiconductor chip C, may have insulating properties. The active side Ca of the semiconductor chip C may be sufficiently protected by the first sealant 42 and/or the under-fill 60. It may be possible to reduce the cost of manufacturing a semiconductor package by reducing the volume of the first sealant 42 to only cover an active side Ca of the semiconductor chip C. It may be possible to make a semiconductor package light and thin by reducing a height of the semiconductor package.

Figure 6:
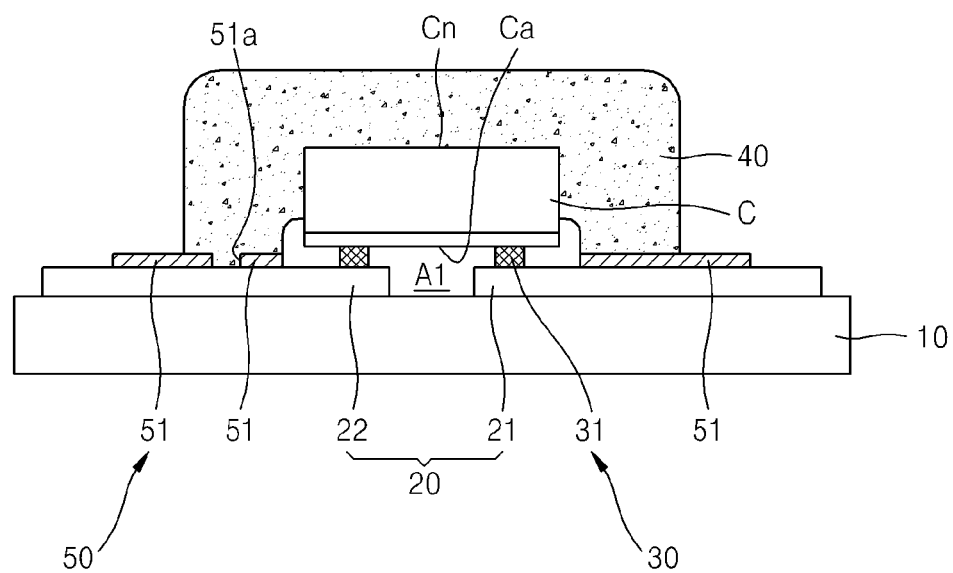
FIG. 6 is a cross-sectional view illustrating a semiconductor package according to an exemplary embodiment.

In some embodiments, and as illustrated in FIG. 6, a space A1 may be formed between the active side Ca of the semiconductor chip C and the substrate 10. In these embodiments, the space A1 may be formed to surround the active side Ca of the semiconductor chip C, the bump 31, and another part of the semiconductor chip C. The shape of the space A1 is not limited to the examples described or depicted herein, so long as the space A1 is able to surround at least the active side Ca of the semiconductor chip C, and the bump 31. The space A1 may be filled by air, nitrogen, an inert gas, or the like, instead of the under-fill 60 of FIG. 4. The type of material that fills the space A1 is not limited to the examples described herein. The type of material may be a non-conductive type of material. In some embodiments, an under-fill 60 that includes an insulating material may be filled in the space A1. In these embodiments, the signal transmitting medium 30 may also be protected.

Because an external static electricity or extra charge on the surface of the semiconductor package may not pass through the space A1, the active side Ca of the semiconductor chip C and the bump 31 may be safely protected from external static electricity or an extra charge on the surface of the semiconductor package. The inclusion of the space A1 in the semiconductor device package may help to safely protect the semiconductor chip C from an external force physically applied to an external surface of the semiconductor device package, such as an external surface of the first sealant 40.

Figure 7:
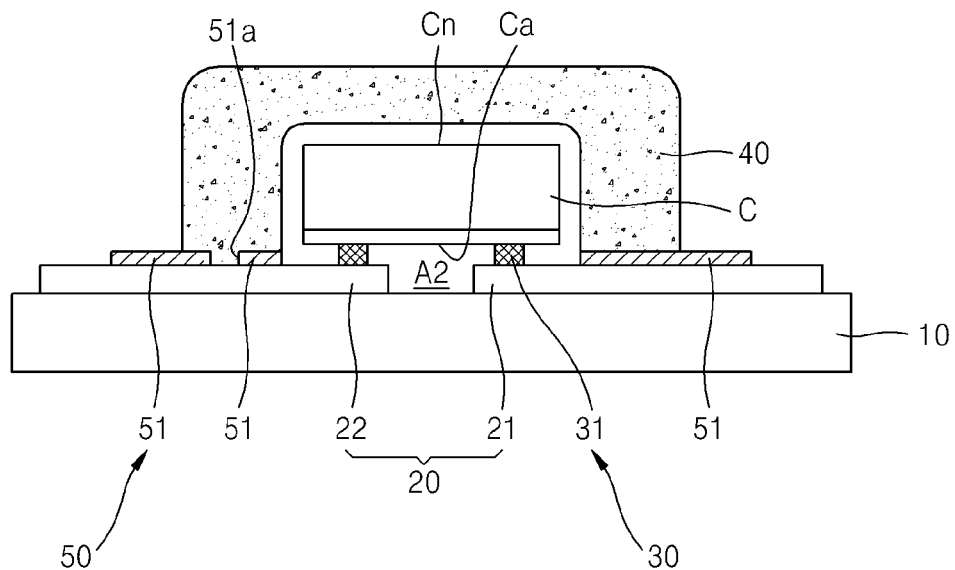
FIG. 7 is a cross-sectional view illustrating a semiconductor package according to an exemplary embodiment.

In some embodiments, and as illustrated in FIG. 7, a space A2 may be formed between the active side Ca of the semiconductor chip C and the substrate 10. For example, a space A2 may be formed between the semiconductor chip C and the first sealant 40 to surround the whole semiconductor chip C. The shape of the space A2 is not limited to the examples described or depicted herein, so long as the space A2 surrounds the whole semiconductor chip C. The space A2 may be filled with materials similar to those available to fill the space A1.

Because an external static electricity or extra charge on the surface of the semiconductor package may not pass through the space A2, the whole semiconductor chip C including the active side Ca and the bump 31 may be safely protected from the external static electricity or extra charge. The inclusion of the space A2 in the semiconductor device package may help to safely protect the semiconductor chip C from an external force physically applied to an external surface of the semiconductor device package, such as an external surface of the first sealant 40.

Figure 8:
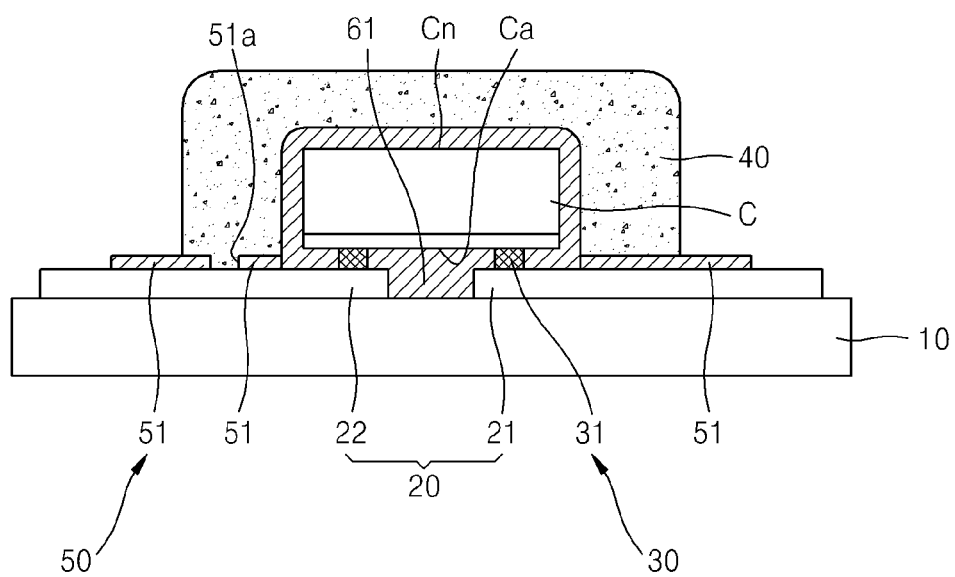
FIG. 8 is a cross-sectional view illustrating a semiconductor package according to an exemplary embodiment.

In some embodiments, and as illustrated in FIG. 8, an under-fill 61 may be filled in the space A2. In these embodiments, the signal transmitting medium 30 may be protected. The under-fill 61 may include an insulating material. Because an external static electricity or extra charge on the surface of the semiconductor package may not pass through the under-fill 61, the whole semiconductor chip C including the active side Ca, the signal transmitting medium 30, and the bump 31 may be safely protected from the external static electricity or extra charge.

Figure 9:
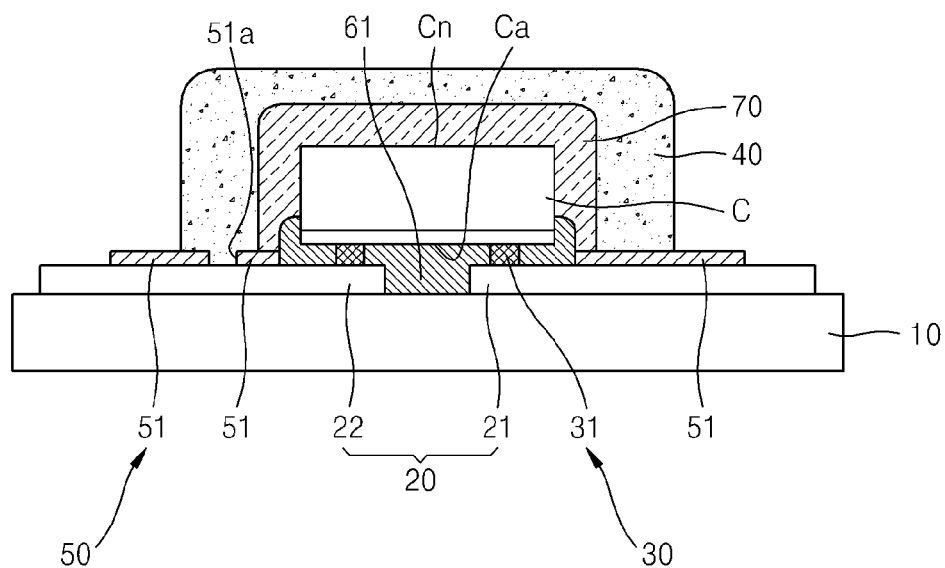
FIG. 9 is a cross-sectional view illustrating a semiconductor package according to an exemplary embodiment.

In some embodiments, and as illustrated in FIG. 9, a semiconductor package may include a second sealant 70 disposed between the first sealant 40 and the semiconductor chip C. The second sealant 70 may surround the semiconductor chip C to protect it and may include an insulating material. The shape of the second sealant 70 is not limited to the examples described or depicted herein, as long as the second sealant 70 covers the whole semiconductor chip C.

In some embodiments, the second sealant 70, which may protect the semiconductor chip C from the first sealant 40, may be formed with a physically different material from that of the under-fill 61. For example, the second sealant 70 may include a material having a different ductility, coefficient of thermal expansion and/or elasticity from the material of the under-fill 61. The under-fill 61 may be formed with a material having a relatively close organization or a high strength, and the second sealant 70 may be formed with a material having relatively ductile physical properties and a low strength. Because an external static electricity or extra charge on the surface of the semiconductor package may not pass through the second sealant 70 and the under-fill 61, the whole semiconductor chip C, including the active side Ca and the bump 31, may be safely protected from the static electricity or extra charge. Using both the second sealant 70 and the under-fill 61, the semiconductor chip C may be doubly and solidly protected from various physical or electrical external forces.

Figure 10:
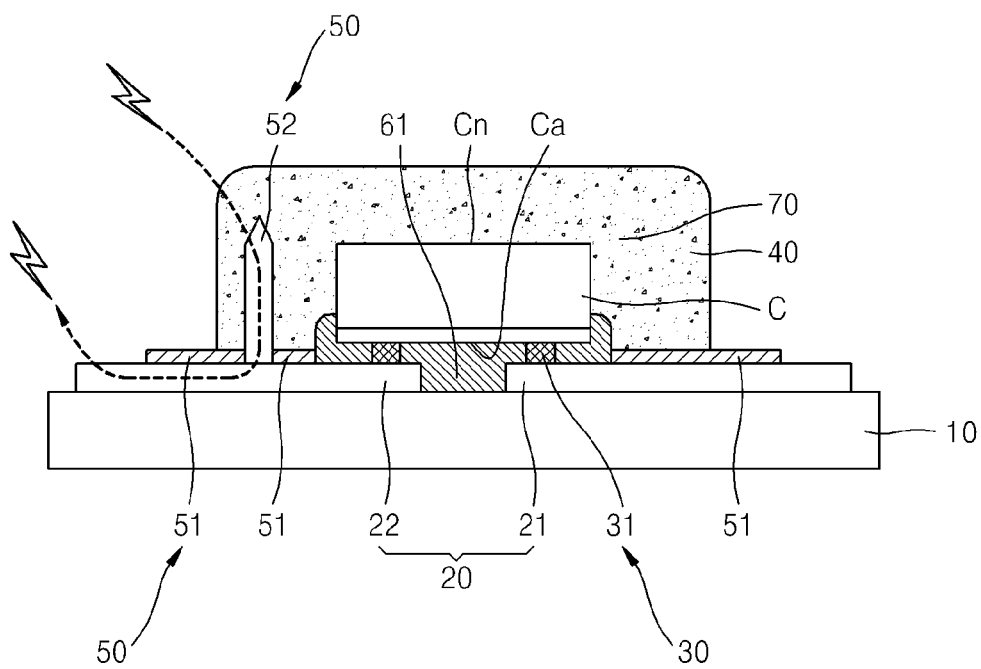
FIG. 10 is a cross-sectional view illustrating a semiconductor package according to an exemplary embodiment.

In some embodiments, and as illustrated in FIG. 10, a semiconductor package may include a static electricity inducer 52. The static electricity inducer 52 may contact the first sealant 40 and may be electrically connected with the static electricity inducing terminal 22. In one embodiment, the static electricity inducer 52 is not exposed to the outside by the first sealant 40. The static electricity inducer 52 may include a conductive material. For example, the static electricity inducer 52 may be formed with a metal material with a property of very high electrical conductivity. In some embodiments, the static electricity inducer 52 may be formed of the same material as the static electricity inducing terminal 22. In some embodiments, if an external static electricity or extra charge is on an external surface of the first sealant 40, the first sealant 40 may be polarized and/or may have electrical conductivity. In these embodiments, a current may flow through the first sealant 40. The static electricity or extra charge may be collected in the static electricity inducer 52 and be removed to the outside through the static electricity inducing terminal 22. In some embodiments, the static electricity inducer 52 may include a sharp top portion formed as a vertical hem. The vertical hem of the static electricity inducer 52 may be formed in various shapes which are advantageous to collect the static electricity or extra charge. For example, the vertical hem of the static electricity inducer 52 may be formed in a ring shape, a lightning rod shape, a line shape, a mesh shape, and the like. The shape of the vertical hem is not limited to the examples described herein.

Figure 11:
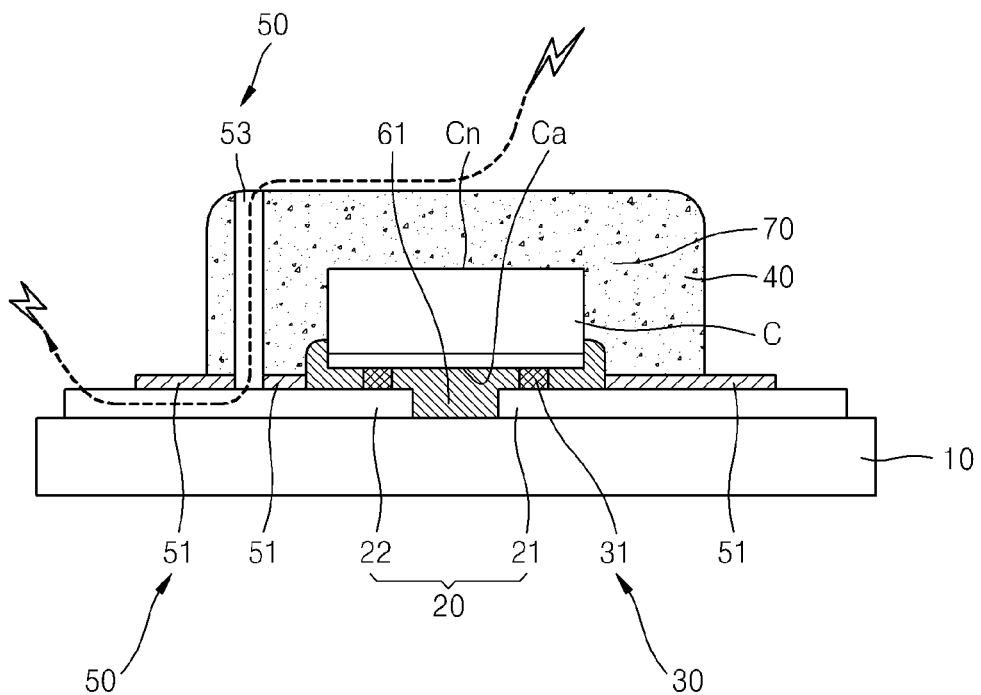
FIG. 11 is a cross-sectional view illustrating a semiconductor package according to an exemplary embodiment.

In some embodiments, and as illustrated in FIG. 11, a static electricity inducer 53 may be similar to the static electricity inducer 52 and may also have one end that is exposed to the outside through the first sealant 40. For example, the exposed end of the static electricity inducer 53 may be formed in an opening of the first sealant 40. The static electricity inducer 53 may include a conductive material. For example, the static electricity inducer 53 may be formed with a metal material with a property of very high electrical conductivity. In some embodiments, the static electricity inducer 53 may be formed of the same material as the static electricity inducing terminal 22. In some embodiments, if an external static electricity (or an extra charge) is applied to the first sealant 40, static electricity (or extra charge) flowing through the inside of the first sealant 40 as well as static electricity (or extra charge) flowing along an external surface of the first sealant 40 may be collected in the static electricity inducer 53. The collected static electricity (or extra charge) then may be removed to the outside through the static electricity inducing terminal 22. In some embodiments, an exposed end of the static electricity inducer 53 may be rectangular in shape when viewed from a top of the semiconductor package, with an exposed end surface that may be flat. The static electricity inducer 53 and/or the exposed end of the static electricity inducer 53 may be formed in various shapes which are advantageous to collect a surface static electricity. For example, the exposed end of the static electricity inducer 53 may have a star shape, a cross shape, a polygon shape, a projection shape, a lightning rod shape, a line shape, and the like, when viewing the exposed side of the static electricity inducer 53 from a top of the semiconductor package. In some embodiments, the exposed end of the static electricity inducer 53 may extend past the first sealant 40, such that a portion of the static electricity inducer 53 other than the end surface of the exposed end is exposed to the outside.

Figure 12:
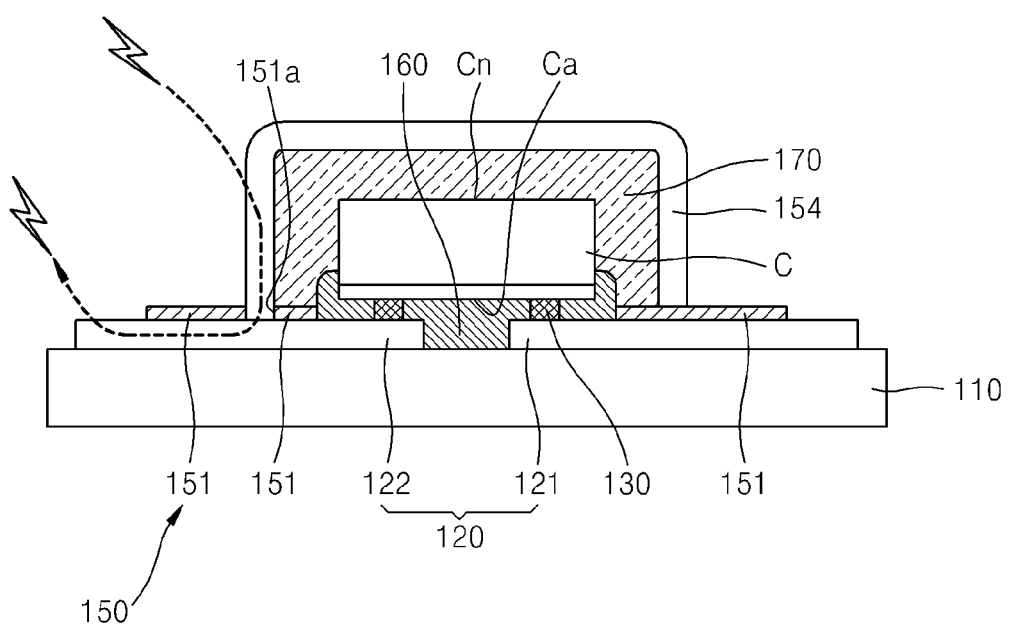
FIG. 12 is a cross-sectional view illustrating a semiconductor package according to an exemplary embodiment.

In some embodiments, and as illustrated in FIG. 12, a semiconductor package may include a semiconductor chip C, a substrate 110 supporting the semiconductor chip C, at least one terminal 120 which is formed on the substrate 110, a signal transmitting medium 130 electrically connecting the semiconductor chip C to the terminal 20, and a first external covering, such as a static electricity inducer 154 which induces static electricity applied from the outside to flow to the predetermined terminal 120. The static electricity inducer 54 may include a conductive material, and may be formed to surround the semiconductor chip C. The shape of the static electricity inducer 54 is not limited to the examples described or depicted herein; the static electricity inducer 54 may have any shape, so long as it surrounds the semiconductor chip C.

In some embodiments, the terminal 120 may include a communication terminal 121 which is disposed on the substrate 110 and protected from static electricity, and a static electricity inducing terminal 122. The communication terminal 121 may be disposed on the substrate 110 and may be protected from static electricity. The static electricity inducing terminal 122 may be electrically distinguished from the communication terminal 121 and may also be disposed on the substrate 110. The static electricity inducing terminal 122 may be disposed on the substrate so that static electricity on and/or in the semiconductor package may flow through the static electricity inducing terminal 122. The static electricity inducing terminal 122 may be a ground terminal.

The semiconductor package may also include a static electricity blocking unit 150. The static electricity blocking unit 150 may induce static electricity applied to the static electricity inducer 154 to flow to the static electricity inducing terminal 122 by providing a conductive connection between the static electricity inducer 154 and the static electricity inducing terminal 122. The static electricity blocking unit 150 may include a static electricity blocking layer 151 disposed between the static electricity inducer 154 and the communication terminal 121. The static electricity blocking layer 151 may cover the communication terminal 121 and may insulate the communication terminal 121 from the static electricity inducer 154. The static electricity blocking layer 151 may be disposed between the static electricity inducer 154 and the communication terminal 121 such that no conductive pathway exists between the communication terminal 121 and the static electricity inducer 154. The static electricity blocking layer 151 may include a penetrating opening 151*a* that is formed in the static electricity blocking layer 151 to electrically connect the static electricity inducing terminal 122 and the static electricity inducer 154. In some embodiments, the penetrating opening 151*a* may be formed to provide a conductive pathway between the static electricity inducing terminal 122 and the static electricity inducer 154. In these embodiments, the static electricity inducing terminal 122 is electrically connected to the static electricity inducer 154.

In some embodiments, an under-fill 160 may be disposed in the semiconductor package so as to surround the signal transmitting medium 130 and protect the signal transmitting medium 130. In some embodiments, a third sealant 170 may also be disposed between the static electricity inducer 154 and the semiconductor chip C. In the embodiments in which an under-fill 160 is also disposed in the semiconductor package, the third sealant 170 may be disposed between the static electricity inducer 154, the semiconductor chip C and the under-fill 160. The third sealant 170 may include an insulating material. In some embodiments, the static electricity inducer 154 may be formed with a metal material that has a property of very high electrical conductivity. For example, the static electricity inducer 154 may be formed of the same material as the static electricity inducing terminal 122. In some embodiments, if an external static electricity is applied to the static electricity inducer 154, the static electricity may be collected in the static electricity inducer 154 and be removed to the outside through the static electricity inducing terminal 122. In some embodiments, the static electricity inducer 154 may be formed in a box shape surrounding the semiconductor chip C, and the semiconductor chip C may be protected from the static electricity by the third sealant 170 disposed therebetween. The shape of the static electricity inducer 154 is not limited to the examples described herein.

Figure 13:
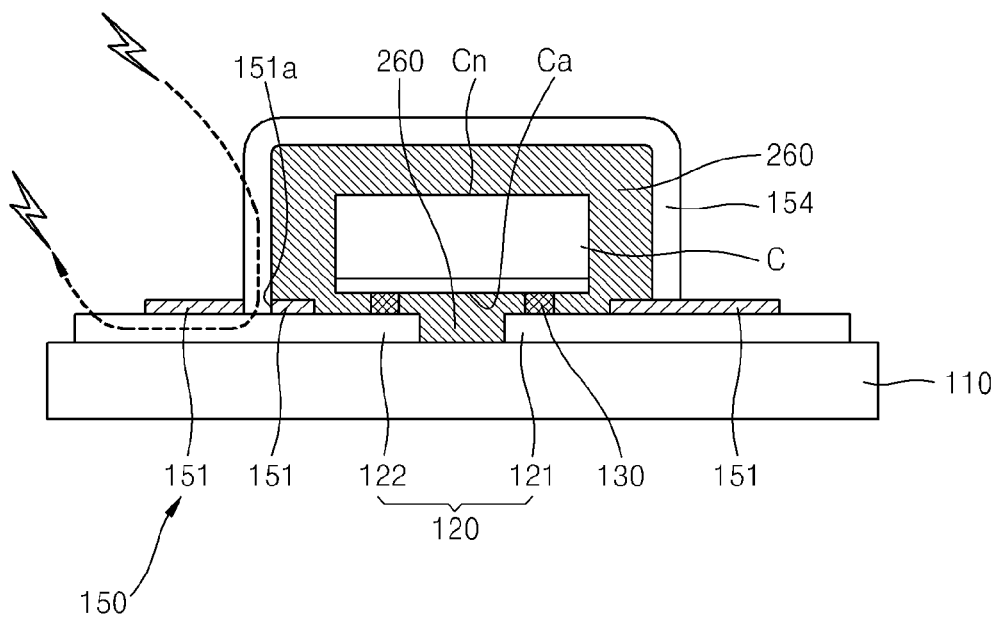
FIG. 13 is a cross-sectional view illustrating a semiconductor package according to an exemplary embodiment.

In some embodiments, and as illustrated in FIG. 13, the semiconductor package may include an under-fill 260 instead of the third sealant 170. The under-fill 260 may be disposed between the static electricity inducer 154 and the semiconductor chip C. The under-fill 260 may cover the whole semiconductor chip C and the bump 31. The under-fill 260 may include one or more of the materials that may have been included in any of the exemplary under-fills described herein (i.e. under-fills 60, 61, 160). In some embodiments, the under-fill 260 may be used along with the third sealant 170 such that the third sealant 170 is disposed between the under-fill 260, the semiconductor chip C, and the static electricity inducer 154.

Figure 14:
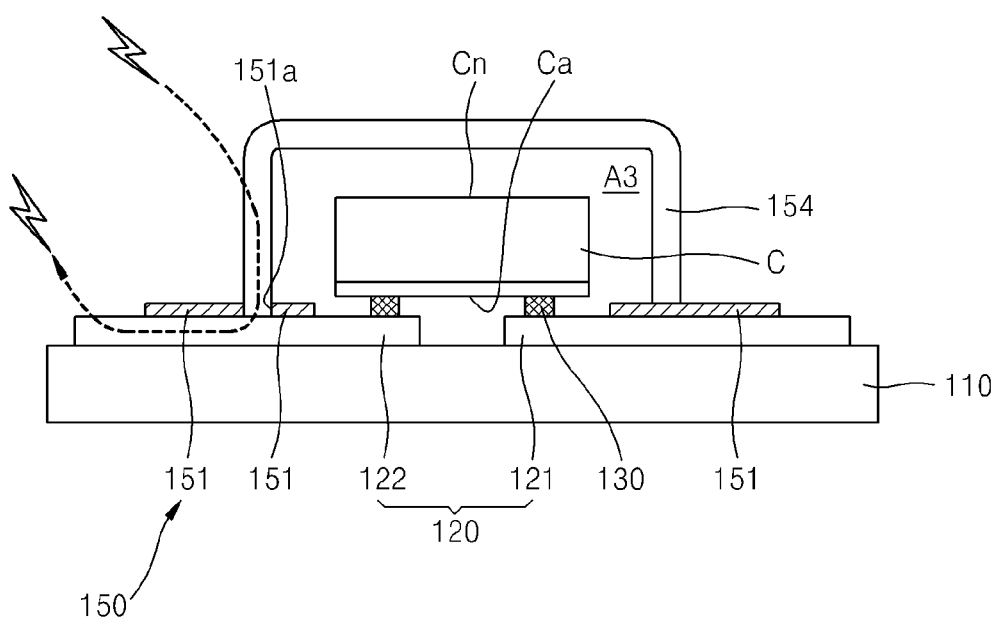
FIG. 14 is a cross-sectional view illustrating a semiconductor package according to an exemplary embodiment.

In some embodiments, and as illustrated in FIG. 14, a space A3 may be disposed between the static electricity inducer 154 and the semiconductor chip C. The space A3 may cover the whole semiconductor chip C and the bump 31. The space A3 may be filled with air, nitrogen, an inert gas, or the like. The space A3 may be filled with any of the materials that may be used to fill the spaces A1 or A2. As illustrated in FIGS. 12 and 13, the semiconductor chip C may be protected from static electricity or extra charges by the third sealant 170, the under-fill 260, and/or the space A3.

In some embodiments, and as illustrated in FIG. 15, an exemplary semiconductor package may include a wire 232 instead of the bump 31. Like the bump 31, the wire 232 may serve as a kind of the signal transmitting medium 30.

An exemplary semiconductor package, as illustrated in FIG. 15, may include a semiconductor chip C, a substrate 210 supporting the semiconductor chip C, at least one terminal 220 which is formed on the substrate 210, the wire 232 electrically connecting the semiconductor chip C to the terminal 220, an external covering such as a fourth sealant 240 that protects the semiconductor chip C by surrounding it, a fifth sealant 241 that protects the wire 232 and the semiconductor chip C, and a static electricity blocking unit 250. The fifth sealant 241 may include an insulating material. The static electricity blocking unit 250 may induce static electricity applied to or on an external surface of the fourth sealant 240 to flow to the predetermined terminal 220.

In some embodiments, the fourth sealant 240 may include a voltage sensitive material that changes from an insulator to a conductor when a large voltage is applied. For example, the voltage sensitive material may contain properties that change from being insulating to having electrical conductivity when a voltage which is equal to or higher than a threshold voltage is input. In some embodiments, the threshold voltage is a physical properties conversion value that corresponds to the insulating properties of the voltage sensitive material. In some embodiments, the voltage sensitive material of the fourth sealant 240, which is an insulator, may be a poor conductor. A sudden charge of electrons, due to static electricity, an electrical shock, and/or an overvoltage that exceeds a threshold voltage level of the voltage sensitive material may cause the voltage sensitive material to become polarized and/or act as a conductor. In some embodiments, the voltage sensitive material of the fourth sealant 240 may include the same materials as the first sealant 40.

In some embodiments, the terminal 220 may include at least one communication terminal 221 and at least one static electricity inducing terminal 222 disposed on the substrate 210. The communication terminal 221 may be protected from the static electricity, and may be electrically distinguished from the static electricity inducing terminal 222. The static electricity inducing terminal 222 may be disposed on the substrate 210 so that static electricity on the fourth sealant 240 may flow to the static electricity inducing terminal 222. The static electricity inducing terminal 222 may be a ground terminal.

In some embodiments, the semiconductor chip C may be disposed on the substrate 210 by using an adhesive layer 211. In these embodiments, an active side Ca of the semiconductor chip C faces upward. The active side Ca of the semiconductor chip C may be connected to the communication terminal 221 and the static electricity inducing terminal 222 via one or more wires 232.

In some embodiments, the static electricity blocking unit 250 may include a static electricity blocking layer 251 disposed between the fourth sealant 240 and the communication terminal 221. The static electricity blocking layer 251 may cover the communication terminal 221 and may insulate the communication terminal 221 from the fourth sealant 240. A penetrating opening 251a may be formed in the static electricity blocking layer 251 to expose the static electricity inducing terminal 222 to the fourth sealant 240. The static electricity blocking unit 250, the static electricity blocking layer 251, and the penetrating opening 251a, may be similar to the static electricity blocking unit 50, the static electricity blocking layer 51, and the penetrating opening 51a, respectively. For example, the penetrating opening 51a may be a hole or other opening in the static electricity blocking layer 251. In some embodiments, the penetrating opening 251a may be formed to provide a conductive pathway between the static electricity inducing terminal 222 and the fourth sealant 240. In these embodiments, the static electricity inducing terminal 222 is electrically connected to the fourth sealant 240. In some embodiments, the static electricity blocking layer 251 may be a solder resist layer.

In some embodiments, a static electricity flow condition of an exemplary semiconductor package may be as follows. As illustrated in FIG. 15, if static electricity or extra charge is applied to the fourth sealant 240 from the outside, the fourth sealant 240, which has insulating properties, may be polarized and/or have an electrical conductivity. The fourth sealant 240 may transmit the static electricity or extra charge to the static electricity inducing terminal 222 through the penetrating opening 251a. The static electricity inducing terminal 222, which is grounded to the outside, may remove the static electricity or extra charge to the outside along the dotted line arrow of FIG. 15.

In some embodiments, although the static electricity inducing terminal 222 is electrically connected with the semiconductor chip C through the wire 232, an electrical capacity of the static electricity inducing terminal 222 is much larger than that of the semiconductor chip C because the static electricity inducing terminal 222 is grounded to the outside. In these embodiments, the static electricity does not flow to the semiconductor chip C, and the semiconductor chip C may be physically ad/or electrically protected from static electricity or an extra charge due to overvoltage or electrical shock.

In a severe production environment or a severe use environment, reliability, durability, and productivity of the semiconductor package may be improved by protecting the semiconductor device C from static electricity or extra voltage directly or indirectly applied to an external surface of the semiconductor package (i.e. first sealant 40, first sealant 42 fourth sealant 240, etc.). Using an exemplary semiconductor package described herein, it may be possible to successfully endure a strict static electricity test such as applying a high voltage to the semiconductor package by using a static electricity gun. It may be possible to greatly reduce a size of a semiconductor package using the exemplary embodiments described herein. For example, it may not be necessary to form a separate communication circuit in the semiconductor chip or the substrate. The under-fill (i.e. under-fill 60, under-fill 160), along with the outermost sealant (i.e. first sealant 40, fourth sealant 240, etc.) may strongly protect the semiconductor chip C from an electrical or physical impact due to static electricity or an extra voltage or charge.

In an exemplary semiconductor package, the package may include or one more chips and/or chip stacks. For example, the semiconductor chip C may be a semiconductor chip stack including a plurality of chips electrically connected to each other. In another example, the semiconductor chip C could be a plurality of chips in the semiconductor package that are not electrically connected as part of a stack. In some embodiments, each chip and/or each chip stack is protected from an extra charge or static electricity in the same manner as a single semiconductor chip. For example, each chip and/or chip stack in a semiconductor package is surrounded by one or more of an under-fill (e.g. under-fill 60) and an external sealant (e.g. first sealant 40). Each chip and/or chip stack in the semiconductor package may have a corresponding static electricity inducing terminal (e.g. static electricity inducing terminal 22) and a corresponding penetrating opening (e.g. penetrating opening 51a) in a static electricity blocking layer (e.g. static electricity blocking layer 51). Each chip and/or chip stack in the semiconductor package may also have one of a static electricity inducer (e.g. static electricity inducer 54) and a voltage sensitive material (e.g. first sealant 40) covering the chip and/or chip stack.

The semiconductor package may be a single package or a package-on-package device. As mentioned above, the semiconductor package may include one or more chips, and may include one or more chip stacks. The semiconductor package could be part of a personal data assistant (PDA), smart phone, camera, LCD, computer, laptop, etc. The potential use and integration of the semiconductor package is not limited to the examples described herein.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be determined by the broadest permissible interpretation of the following claims and their equivalents, and shall not be restricted or limited by the foregoing detailed description.

What is claimed is:

1. A semiconductor package comprising:
   a substrate;
   at least a first semiconductor chip disposed on the substrate;
   at least a first communication terminal disposed on the substrate, the first communication terminal being electrically connected to the first semiconductor chip and to an external source;
   at least a first inducing terminal disposed on the substrate, the first inducing terminal being electrically connected to the semiconductor chip and to a ground;
   an external covering enclosing at least a portion of the first semiconductor chip, an external surface of the external covering being exposed to the outside of the semiconductor package;
   a static electricity blocking layer disposed between the external covering and the first inducing terminal and between the external covering and the first communication terminal, the static electricity blocking layer configured to prevent a conductive pathway from being formed between the external covering and the first communication terminal; and
   at least a first opening formed in the static electricity blocking layer,
   wherein the external covering is configured to be electrically connected to the first inducing terminal via the first opening.

2. The semiconductor package of claim 1,
   wherein the external covering comprises a first sealant, the first sealant comprising a voltage sensitive material, and
   wherein the voltage sensitive material is an insulator that is configured to become polarized and/or conductive when the semiconductor package is subject to a particular amount of electric charge buildup.

3. The semiconductor package of claim 1, wherein the external covering is disposed such that a backside of the chip is exposed to the outside of the semiconductor package.

4. The semiconductor package of claim 1, further comprising:
   a first space filled with a non-conductive material and disposed to cover at least an active side of the semiconductor chip and to surround at least one signal transmitting unit,
   wherein the signal transmitting unit electrically connects the semiconductor chip to the communication terminal, and
   wherein the external covering is disposed to surround the first space.

5. The semiconductor package of claim 4, wherein the external covering includes a static electricity inducer comprising a conductive material with high electrical conductivity.

6. The semiconductor package of claim 4, wherein the first space is filled with an insulating material.

7. The semiconductor package of claim 4,
   wherein the external covering includes a first sealant comprising a voltage sensitive material, and
   wherein the voltage sensitive material is an insulator that is configured to become polarized and/or conductive when the semiconductor package is subject to a particular amount of electric charge buildup.

8. The semiconductor package of claim 1, further comprising a first sealant disposed between the external covering and the semiconductor chip and configured to surround the whole semiconductor chip, wherein a material of the first sealant is different from a material of the external covering.

9. The semiconductor package of claim 8, wherein the external covering includes a static electricity inducer comprising a conductive material and the first sealant comprises an insulating material.

10. The semiconductor package of claim 1, wherein:
    the signal transmitting unit is a wire,
    the external covering comprises a voltage sensitive material disposed to surround a non-conductive first sealant filled with an insulating material, the first sealant disposed around the signal transmitting unit and at least an active side of the semiconductor chip, and
    the voltage sensitive material of the external covering is different from the non-conductive material of the first sealant.

11. A liquid crystal display (LCD) comprising:
    a driver integrated circuit, wherein the driver integrated circuit comprises the semiconductor package of claim 1,
    wherein the first inducing terminal is connected to at least one of a ground line of a printed circuit board disposed in the LCD or a ground line of a LCD panel disposed in the LCD.

12. A semiconductor package comprising:
    a substrate;
    at least a first semiconductor chip disposed on the substrate;
    at least a first terminal disposed on the substrate, the first terminal being electrically connected to the semiconductor chip and to an external source;
    a second terminal disposed on the substrate, the second terminal being electrically connected to the semiconductor chip and to a ground;
    a first sealant surrounding at least a portion of the semiconductor chip, the first sealant comprising a voltage sensitive material;
    a static electricity blocking layer disposed between the first sealant and the second terminal and between the first sealant and the first terminal, the static electricity blocking layer configured to prevent a conductive pathway from the first sealant to the first terminal; and
    a static electricity inducer including a conductive material, the static electricity inducer disposed to contact the first sealant and to be electrically connected to the second terminal.

13. The semiconductor package of claim 12, wherein the voltage sensitive material comprises an insulator, and the voltage sensitive material is configured to become polarized and/or conductive when the semiconductor package is subject to a particular amount of electric charge buildup.

14. The semiconductor package of claim 12, wherein the static electricity inducer is electrically connected to the second terminal via an opening formed in the static electricity blocking layer.

15. The semiconductor package of claim 12, wherein the static electricity inducer comprises a same material as the second terminal.

16. The semiconductor package of claim 12, wherein at least a top surface of the static electricity inducer is exposed to the outside of the semiconductor package.

17. The semiconductor package of claim 12, wherein the static electricity inducer is disposed to surround the first sealant such that the first sealant is no longer exposed to the outside of the semiconductor package.

18. A semiconductor package comprising:

a substrate;

at least a first semiconductor chip disposed on the substrate;

at least a first communication terminal disposed on the substrate, the first communication terminal being electrically connected to the first semiconductor chip and to an external source;

at least a first inducing terminal disposed on the substrate, the first inducing terminal being electrically connected to the semiconductor chip and to a ground;

at least a first space filled with a non-conductive material and disposed to cover at least an active side of the first semiconductor chip and to surround at least one signal transmitting unit, wherein the signal transmitting unit is configured to electrically connect the first semiconductor chip to the first communication terminal;

a static electricity inducer including a conductive material, the static electricity inducer disposed to surround the first space and to be electrically connected to the first inducing terminal; and a static electricity blocking layer disposed between the static electricity inducer and the first inducing terminal and between the static electricity inducer and the first communication terminal, the static electricity blocking layer configured to prevent a conductive pathway from being formed between the static electricity inducer and the first communication terminal.

19. The semiconductor package of claim 18, wherein the static electricity inducer is electrically connected to the first inducing terminal via an opening formed in the static electricity blocking layer.

20. The semiconductor package of claim 18, wherein the first space comprises a first sealant comprising a first insulating material, the first space disposed to surround an under-fill that comprises a second insulating material, the under-fill disposed to surround at least the active side of the semiconductor chip and the signal transmitting unit, and wherein the first insulating material is different from the second insulating material.

\* \* \* \* \*